United States Patent
Hunziker

(10) Patent No.: US 10,992,055 B2
(45) Date of Patent: Apr. 27, 2021

(54) COMPONENT CARRIER WITH INTEGRATED ANTENNA ARRANGEMENT, ELECTRONIC APPARATUS, RADIO COMMUNICATION METHOD

(71) Applicant: AT&S Austria Technologie & Systemtechnik Aktiengesellschaft, Leoben (AT)

(72) Inventor: Urs Hunziker, Meilen (CH)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 43 days.

(21) Appl. No.: 16/097,312

(22) PCT Filed: Apr. 28, 2017

(86) PCT No.: PCT/EP2017/060197
§ 371 (c)(1),
(2) Date: Oct. 29, 2018

(87) PCT Pub. No.: WO2017/186913
PCT Pub. Date: Nov. 2, 2017

(65) Prior Publication Data
US 2020/0067198 A1 Feb. 27, 2020

(30) Foreign Application Priority Data
Apr. 28, 2016 (DE) .......................... 102016107936.7

(51) Int. Cl.
*H01Q 1/24* (2006.01)
*H01Q 1/38* (2006.01)
(Continued)

(52) U.S. Cl.
CPC ....... *H01Q 21/064* (2013.01); *H01L 21/4857* (2013.01); *H01L 21/56* (2013.01);
(Continued)

(58) Field of Classification Search
CPC ..... H01L 21/4857; H01L 21/48; H01L 21/56; H01L 2223/6677; H01L 2224/04105;
(Continued)

(56) References Cited

U.S. PATENT DOCUMENTS

| 5,436,441 A | 7/1995 | Inoue |
| 5,450,090 A | 9/1995 | Gels et al. |

(Continued)

FOREIGN PATENT DOCUMENTS

| CN | 101849329 A | 9/2010 |
| CN | 101849369 A | 9/2010 |

(Continued)

OTHER PUBLICATIONS

Marceau, C. et al; Femtosecond Laser Pulse Compression Suing Angle of Incidence Optimization of Chirped Mirrors Laser Physics Letters vol. 11, No. 6, Jun. 1, 2014, 065302.

(Continued)

*Primary Examiner* — Tho G Phan
(74) *Attorney, Agent, or Firm* — Robert A. Blaha; Smith Tempel Blaha LLC

(57) ABSTRACT

A component carrier with a base structure, an antenna arrangement, and an electronic component are disclosed. The antenna arrangement has a first antenna element and a second antenna element, wherein both antennas elements are embedded within the base structure. The electronic component is embedded within the base structure and is operatively connected both with the first antenna element and the second antenna element. The electronic component is an active electronic component capable of providing a first transmit signal to the first antenna element and a second transmit signal to the second antenna element and/or processing a first receive signal received from the first antenna element and a second receive signal received from the second (Continued)

US 10,992,055 B2

Page 2 antenna element. Further, an electronic apparatus comprising such a component carrier and a manufacturing method for such a component carrier are described.

19 Claims, 6 Drawing Sheets

(51) Int. Cl.
  *H01Q 21/06*   (2006.01)
  *H01L 21/48*   (2006.01)
  *H01L 23/66*   (2006.01)
  *H01Q 1/40*    (2006.01)
  *H01L 21/56*   (2006.01)

(52) U.S. Cl.
  CPC .............. *H01L 23/66* (2013.01); *H01Q 1/40* (2013.01); *H01L 2223/6677* (2013.01)

(58) Field of Classification Search
  CPC . H01L 2224/32225; H01L 2224/73267; H01L 23/66; H01L 24/19; H01L 24/20; H01Q 1/40; H01Q 21/00; H01Q 21/06; H01Q 21/0093; H01Q 21/064; H01Q 1/24; H01Q 1/38
  See application file for complete search history.

(56) References Cited

U.S. PATENT DOCUMENTS

| | | | |
|---|---|---|---|
| 5,990,768 A | 11/1999 | Takahashi et al. | |
| 5,995,006 A | 11/1999 | Walsh | |
| 6,002,375 A * | 12/1999 | Corman | H01Q 1/38 257/728 |
| 6,064,350 A | 5/2000 | Uchimura et al. | |
| 6,496,147 B1 * | 12/2002 | Kirino | H01Q 3/28 343/700 MS |
| 6,559,798 B1 | 5/2003 | Marumoto et al. | |
| 6,593,900 B1 | 7/2003 | Craven et al. | |
| 6,837,438 B1 | 1/2005 | Takasugi et al. | |
| 7,012,569 B2 * | 3/2006 | Gottwald | H01Q 1/3233 343/700 MS |
| 7,480,435 B2 | 1/2009 | Brist et al. | |
| 7,508,352 B2 * | 3/2009 | Lempkowski | H01Q 1/40 29/600 |
| 7,864,123 B2 | 1/2011 | Hill et al. | |
| 8,217,842 B2 | 7/2012 | Pedersen et al. | |
| 9,153,863 B2 * | 10/2015 | Nair | H01Q 1/38 |
| 9,196,951 B2 * | 11/2015 | Baks | H01Q 1/2283 |
| 9,252,491 B2 * | 2/2016 | Liu | H01Q 9/0407 |
| 2002/0135523 A1 | 9/2002 | Romero et al. | |
| 2003/0035613 A1 | 2/2003 | Huber | |
| 2003/0059151 A1 | 3/2003 | Brist et al. | |
| 2005/0007296 A1 | 1/2005 | Endo et al. | |
| 2006/0001138 A1 | 1/2006 | Sakama et al. | |
| 2006/0055517 A1 | 3/2006 | Ghabra et al. | |
| 2006/0124753 A1 | 6/2006 | Scholz et al. | |
| 2006/0238420 A1 | 10/2006 | Jansen | |
| 2007/0095925 A1 | 5/2007 | Zhu et al. | |
| 2008/0042917 A1 | 2/2008 | Honma et al. | |
| 2008/0123768 A1 | 5/2008 | Harel et al. | |
| 2009/0021446 A1 | 1/2009 | Kataya et al. | |
| 2009/0224061 A1 | 9/2009 | Kato et al. | |
| 2010/0033395 A1 | 2/2010 | Ding et al. | |
| 2010/0033709 A1 | 2/2010 | Lampin et al. | |
| 2010/0161002 A1 | 6/2010 | Aghassian et al. | |
| 2010/0197261 A1 | 8/2010 | Zibrik et al. | |
| 2011/0024510 A1 | 2/2011 | Kato et al. | |
| 2011/0074584 A1 | 3/2011 | Kataya et al. | |
| 2011/0260919 A1 | 10/2011 | Montag et al. | |
| 2012/0056796 A1 | 3/2012 | Kato et al. | |
| 2012/0306700 A1 | 12/2012 | Ridgeway | |
| 2013/0194146 A1 | 8/2013 | Lee et al. | |
| 2013/0249663 A1 | 9/2013 | Cho | |
| 2013/0271322 A1 | 10/2013 | Harel et al. | |
| 2014/0125927 A1 | 5/2014 | Yoneyama et al. | |
| 2014/0145883 A1 | 5/2014 | Baks et al. | |
| 2014/0285393 A1 | 9/2014 | Biglarbegian et al. | |
| 2015/0035714 A1 | 2/2015 | Zhou | |
| 2015/0070231 A1 | 3/2015 | Park et al. | |
| 2015/0194736 A1 | 7/2015 | Diukman et al. | |
| 2015/0357708 A1 | 12/2015 | Au | |
| 2016/0013556 A1 | 1/2016 | Kato et al. | |
| 2016/0351996 A1 | 12/2016 | Ou | |

FOREIGN PATENT DOCUMENTS

| | | |
|---|---|---|
| CN | 101909408 A | 12/2010 |
| CN | 102247050 A | 11/2011 |
| CN | 104009279 A | 8/2014 |
| CN | 105390854 A | 3/2016 |
| DE | 10 134 958 A1 | 2/2003 |
| DE | 102004054622 A1 | 5/2006 |
| EP | 1 613 134 A2 | 1/2006 |
| EP | 1613134 A2 | 1/2006 |
| EP | 1713022 A1 | 10/2006 |
| EP | 2 141 970 A1 | 1/2010 |
| EP | 2141970 A1 | 1/2010 |
| JP | H10303640 A | 11/1998 |
| JP | 2002344146 A | 11/2002 |
| JP | 3926677 B2 | 6/2007 |
| JP | 2007202017 A | 8/2007 |
| JP | 2007209017 A | 8/2007 |
| JP | 2013247294 A | 12/2013 |
| JP | 2013247494 A | 12/2013 |
| KR | 20100056004 A | 5/2010 |
| KR | 101464261 B1 | 11/2014 |
| KR | 20160008457 A | 1/2016 |
| WO | WO 0023994 A1 | 4/2000 |
| WO | WO2012036844 A1 | 3/2012 |
| WO | WO 2014125927 A1 | 8/2014 |
| WO | WO2015108745 A1 | 7/2015 |

OTHER PUBLICATIONS

Jastram Nathan et al.; "PCB-Based Prototyping of 3-D Micromachined RF Subsystems", IEEE Transactions on Antennas and Propagation, IEEE Service Center, Piscataway, N.J., US, vol. 62, No. 1, Jan. 1, 2014, 420-429 pp., XP011536450, ISSN: 0018-926X [ Retrieved on Dec. 31, 2013].
Jegede, B.A.; Office Action in U.S. Appl. No. 15/546,658; dated Mar. 19, 2020; pp. 1-13; US Patent and Trademark Office, Alexandria, VA, U.S.A.
Jastram Nathan et al.; "PCB-Based Prototyping of 3-D Machined RF Subsystems", IEEE Transactions on Antennas and Propagation, IEEE Service Center, Piscataway, N.J., US, vol. 62, No. 1, Jan. 1, 2014, 420-429 pp., XP011536450, ISSN: 0018-926X [ Retrieved on Dec. 31, 2013].
European Patent Office, Communication Pursuant to Article 94(3) EPC, Application 16701513.0, dated Apr. 5, 2019, 11 pgs., HV Rijswijk, Netherlands.
Office Action in Application No. 201780026390.1; China Intellectual Property Administration; pp. 1-8; dated Mar. 30, 2020; Shanghai, China.
Tajima et al., "300-GHz LTCC Horn Antennas Based on Antenna-in-package Technology", Proceedings of the 43rd European Microwave Conference, Oct. 7-10, 2013, Nuremberg, Germany (Year: 2013).

* cited by examiner

COMPONENT CARRIER WITH INTEGRATED ANTENNA ARRANGEMENT, ELECTRONIC APPARATUS, RADIO COMMUNICATION METHOD

TECHNICAL FIELD

The present invention generally relates to the field of component carriers such as printed circuit boards which are provided with integrated antenna structures in order to form at least a part of a radio communication device. Specifically, the present invention relates to a component carrier with an antenna arrangement comprising two antenna elements. Further, the present invention relates to an electronic apparatus comprising such a component carrier and to a manufacturing method for such a component carrier.

TECHNOLOGICAL BACKGROUND

In the electronic industry the packaging size of integrated electronic circuits or components has been reduced significantly in the last decades. This resulted in a significant increase of the integration density of electronic assemblies and to a corresponding decrease of the size of electronic apparatuses such as for instance radio communication devices (e.g. notebook computers, tablet computers, smart phones, etc.).

A milestone for increasing the integration density of electronic assemblies was the launch of Multi-layer component carriers respectively Multi-layer printed circuit boards (PCBs). In a Multi-layer PCB conductor traces being assigned to different conductor layers are connected with plated-through holes called vias.

An advanced PCB contains electronic components embedded in its base structure. Embedded electronic components can be (a) passive electronic components such as capacitors, resistors or (b) active electronic components such as transistors. Apart from being mechanically protected embedded electronic components also contribute to a further increase in the integration density of electronic assemblies.

Further, there are known component carriers which have an integrated antenna structure and an electronic component connected to the antenna structure.

US 2014/0145883 A1 discloses a printed circuit board (PCB) package structure including a planar core structure made from FR4 material, an antenna structure disposed on one side of the planar core structure, and an interface structure disposed on an opposite side of the planar core structure. The antenna structure and interface structure are each formed of a plurality of laminated layers, each laminated layer having a patterned conductive layer formed on an insulating layer. The antenna structure includes a planar antenna formed on one or more patterned conductive layers of the laminated layers. The interface structure includes a power plane, a ground plane, signal lines, and contact pads formed on one or more patterned conductive layers of the laminated layers of the interface structure. The package structure further includes an antenna feed line structure formed in, and routed through, the interface structure and the planar core structure, and connected to the planar antenna.

U.S. Pat. No. 6,559,798 B1 discloses a phased array antenna formed within a layered structure comprising inter alia dielectric layers which are known from PCBs. A radiating element layer forming the antenna elements of the phased array antenna is located between two dielectric layers. A passive element layer forming passive elements is formed above one of these two dielectric layers such that this one dielectric layer is located in between the radiating element layer and the passive element layer. By driving the antenna elements with appropriate phase shifted signals a so called beam forming can be realized, wherein the direction of the radiation being emitted cooperatively from the antenna elements can be adjusted.

SUMMARY

Although PCB integrated phase array antenna structures represent a big contribution for a high integration density of radio communication devices allowing for a spatially directed radio communication, there may still be a need for a technique allowing for further increasing the integration density of such radio communication devices.

A component carrier, an electronic apparatus, and a method according to the independent claims are provided. Advantageous embodiments of the present invention are described by the dependent claims.

According to a first exemplary embodiment of the invention there is provided a component carrier comprising (a) a base structure; (b) an antenna arrangement having a at least a first antenna element and a second antenna element, wherein both antennas elements are embedded within the base structure; and (c) an electronic component, which is embedded within the base structure and which is operatively connected both with the first antenna element and the second antenna element. The electronic component is an active electronic component which is capable of (i) providing a first transmit signal to the first antenna element and a second transmit signal to the second antenna element and/or (ii) processing a first receive signal received from the first antenna element and a second receive signal received from the second antenna element.

According to an exemplary embodiment, the described component carrier may be based on the idea that an electromagnetic transmitting and/or receiving device, which is capable of communicating with a directional sensitivity, can be realized within a compact design, because all components or elements, which are necessary for controlling and/or performing a directional sensitive communication, are embedded within the base structure.

OVERVIEW OF EMBODIMENTS

The embedded antenna arrangement can be formed not only at an upper, lower and/or lateral side of a component carrier but in particular at least partially within (the 3D dimensions of) the base structure. In the latter design the antenna arrangement is automatically protected from external mechanical impacts. As a consequence, a high robustness of the entire component carrier and its embedded functionality can be achieved.

In accordance with basic physical principles a beamforming can be achieved by combining different signals being associated with different antenna elements in a phased array comprising at least the two antenna elements in such a way that signals at particular angles experience constructive interference while others experience destructive interference. Since antenna elements can be used both for transmitting and receiving electromagnetic signals beamforming can be applied both for transmitting radio communication end devices and for receiving radio communication end devices.

In order to change the directionality of the antenna arrangement when transmitting, the active electronic component controls the phase and relative amplitude of the transmit signal provided to each antenna element in order to create a pattern of constructive and destructive interference in the combined wavefront of the two electromagnetic signals being assigned to the two antenna elements. When receiving, the receive signals from different antenna elements are combined with a predetermined phase shift which depends on the direction with the largest receive sensitivity.

The base structure may be any type of support element, preferable a flat support element, which is capable of receiving the antenna arrangement and the electronic component in an embedded manner. The base structure may be e.g. a printed circuit board, a substrate or any other type of support element, which can be used for building up electronic assemblies respectively electronic circuits. The base structure may comprise at least one dielectric layer and a metallic layer, which is attached at the dielectric layer. The metallic layer may be patterned in order to form appropriate signal traces for (a) connecting the described antenna arrangement with the described electronic component and/or for (b) electrically connecting components of such an electronic assembly or electronic circuit.

The antenna arrangement respectively the at least two antenna elements may by formed from an electrically conductive material. Alternatively or in combination they may be formed by a recess or a slot formed within a structure made from an electrically conductive material. Such a structure may be for instance a hollow conductor. In this case the antenna element may be denominated a slot antenna (element). The conductive material may be any material which provides for an electric conductivity which is sufficient such that the described antenna arrangement is usable for a wireless radio communication. Apart from a metallic material also other conductive materials can be used such as e.g. conductive carbon, a semiconductor material (e.g. optically transparent Indium gallium zinc oxide) or adhesive plaster with metallic stripes (e.g. silver stripes). Further, Diamond Like Carbon (DLC) layers, carbon monolayers (graphene) or a mixture of binder and metallic/conductive particles (so called conductive ink) may be used as the conductive material. In case the conductive material of the antenna arrangement is a metallic material this metallic material may be preferably the same material as the material being used for the (at least one) metallic layer of the base structure. This may provide the advantage that the antenna arrangement can be formed in an easy manner already during a fabrication of the base structure. Preferably, the metallic material comprises copper or is copper. Of course, also another material with a higher conductivity than copper such as gold or carbon nanotubes (CNT) may be used.

Each one of the described antenna elements may comprise two different portions. In this case a first portion is connected to a first terminal of the electronic component, which first terminal is assigned to the respective antenna element, and a second portion is connected to a second terminal of the electronic component, which second terminal is also assigned to this antenna element. This means that the embedded electronic component comprises at least four terminals, two of them being assigned to the first antenna element and the other two of them being assigned to the second antenna element.

The "term" electronic component has to be understood in a broad sense. For instance, the described electronic component may be realized by means of a single (active) electronic component part which is incorporated within a single housing or package. However, the electronic component may also comprise two (active) electronic component parts which operate in a coordinated manner. Thereby, a first electronic component part may be connected and/or assigned to the first antenna element and the second electronic component part may be connected and/or assigned to the second antenna element. Further, the electronic component may also comprise a plurality of electronic component parts wherein at least some of them are interconnected with each other in order to form an appropriate electronic circuitry. It is also possible that apart from at least one electronic component part there may be other component parts which are not embedded but, for instance surface mounted on the base structure.

The active electronic component may be a "wireless communication component". This means that the active electronic component is capable of controlling, performing, and/or participating in a radio communication, wherein data are transferred in a wireless manner. The wireless communication component may be a component within a housing. Preferably, the (embedded) wireless communication component may be a bare die or a chip. Further, the wireless communication component may comprise appropriate electric circuits such as an electronic transmitting circuit and/or an electronic receiving circuit.

The term "active electronic component" may denote an electronic component which, by contrast to a passive electronic component, relies on a source of energy (usually from the DC supply voltage) in order to inject electric power into an electronic circuit. Therefore, an active electronic component comprises at least three contact terminals for electrically contacting the same. Active electronic components include in particular at least one amplifying component such as for instance a transistor. An active electronic component may in particular comprise a semiconductor material.

In this document the term "embedded" may particularly denote that the respective element, i.e. one of the two antenna elements and the electronic component is located within an opening formed in or at the base structure. Thereby, the term "opening" may denote any type of recess or cavity formed in or at the base structure. The opening might even be a metallized via formed within the base structure, which metallized via connects different antenna element portions. In this case also the metallized via represents a portion of the respective antenna element.

It is mentioned that very small electrically conductive material antenna elements (embedded within or at the surface of the base structure) can also be formed by means of laser pulses having a duration of femtoseconds. Such small antenna elements, which may be denominated Nano antennas, may be used for very intense electromagnetic or photonic waves. Further information can be taken from the publication Laser Physics Letters Vol 11, Number 6, 1 Jun. 2014, 065302.

It is pointed out that it is not necessary that the described openings are a free or unfilled (e.g. filled with air) openings. It is only necessary that during the manufacture of the described component carrier the respective opening is free or unfilled at least at a certain processing stage. In the final state of the electronic assembly the opening may be filled e.g. with a protective or any other functional material.

According to a further embodiment of the invention the electronic component is configured for (a) introducing a phase shift between the first transmit signal and the second transmit signal; (b) changing the amplitude of the of first transmit signal and/or of the second first transmit signal; (c) detecting a phase to shift between the first receive signal and the second receive signal; and/or (d) determining the amplitude of the of first receive signal and/or of the second receive transmit signal. This may provide the advantage that described component carrier comprise all the functionality which is need in order to perform the above described beam forming. Thereby, the antenna arrangement can be operated like a phased array. This holds both for the case of transmitting electromagnetic radiation as well as for receiving electromagnetic radiation.

In this respect it is (again) mentioned that for performing the described actions the electronic component may comprises not only one electronic component part. In particular, apart from the described embedded electronic component (part) there may be other electronic component parts (embedded or not embedded). These other electronic component parts maybe active or/and passive electronic components parts.

According to a further embodiment of the invention the component carrier further comprises a first conductor trace connecting the electronic component with the first antenna element and a second conductor trace connecting the electronic component with the second antenna element.

At least one of the conductor traces may be realized by an appropriately patterned metallic layer of the base structure. This may provide the advantage that the interconnecting circuitry of the described component carrier may be realized by means of a well-established procedure which is known for instance for manufacturing printed circuit boards.

Via the two conductor traces the antenna elements will be provided with the respective transmit signals. Alternatively or in combination the two conductor traces are used by the embedded electronic component for receiving signals from the respective antenna elements. In this respect it is mentioned that a conductor trace connection may be realized directly via an appropriate conductor trace or indirectly via a further electronic component and at least one further conductor trace. The further electronic component may be embedded within or attached to the base structure.

According to a further embodiment of the invention the first conductor trace and/or the second conductor trace has a length of less than 600 mm, preferably less than 400 mm, more preferably less than 200 mm, more preferably less than 100 mm, more preferably less than 50 mm, more preferably less than 20 mm, more preferably less than 10 mm, and most preferably less than 5 mm.

This may provide the advantage that the radio functionality of the described component carrier can be realized with an electronic assembly which can be built up within compact dimensions. This may be in particular of advantage for high frequency radio communication applications. With a suitable high frequency embedded chip and an appropriate high frequency link between the embedded active electronic component and the antenna arrangement radio frequencies up to the Terahertz ($10^{+12}$ Hz) regime are possible. A further advantage of a short conductor trace extending between the embedded active electronic component and the respective antenna element is a small ohmic resistance which yields small losses of the electric signals travelling between the embedded active electronic component and the respective antenna element. Furthermore, a short conductor trace will typically exhibit a small capacitance and a small inductance. This results in a beneficial manner in a small amount of unwanted radio signals which are radiated by the respective conductor trace. Therefore, there will be less unwanted interference with neighboring electronic devices even when operating the described component carrier with high frequency. In other words, with the help of short conductor traces the described component carrier will be characterized by a very good electromagnetic compatibility and a high sensitivity for receiving electromagnetic signals.

It is mentioned that of course the size respectively the length of the conductor traces may depend on the size of the radio communication device. The larger the radio communication device is, the larger the freedom of design for the described antenna arrangement will be.

It is further mentioned that in particular within buildings reflection tests have revealed that an excellent reflection suppression may be achieved for distances between different antenna elements which are in the range between 2 and 500 mm. Therefore, depending on the specific application it may not be necessary to exploit the entire spatial extension of the respective radio communication device in order to obtain an optimal radio channel quality between two radio connected radio communication devices.

According to a further embodiment of the invention the first conductor trace and/or the second conductor trace consists of a number of N straight conductor trace portions, wherein the number N is smaller than 5, in particular smaller than 4, further in particular smaller than 3, and furthermore in particular smaller than 2.

This means that the respective conductor trace is comprised of one, two, three, or four straight conductor trace portions. In case of more than one straight conductor trace portion neighboring or adjacent conductor trace portions may be connected with each other by at least one curved, bent, and/or cornered conductor trace portion.

Preferably, the number of straight conductor trace portions is small. This may mean that in the spatial design of the conductor trace(s) there are only few or no intentional corners or curved portions. Since any non-straight section of a conductor trace results in a comparatively strong electromagnetic emission, the described embodiment with only a few curvatures may further increase the above mentioned electromagnetic compatibility.

According to a further embodiment of the invention (a) the antenna arrangement and the electronic component are configured for operating at a predetermined wavelength and (b) the at least one straight conductor trace portion has a length which is less than $\frac{1}{2}$, preferably less than $\frac{1}{4}$, more preferably less than $\frac{1}{8}$, more preferably less than $\frac{1}{16}$ mm, more preferably less than $\frac{1}{32}$, and most preferably less than $\frac{1}{64}$ of the predetermined wavelength.

The predetermined wavelength may be for instance a center wavelength corresponding to a certain center frequency. Typically, for each type of communication application there exists a specified center frequency which is often also called a carrier frequency.

As has already been mentioned above a possible of the conductor traces may also depend on the size of the radio communication device which comprises the described component carrier.

According to a further embodiment of the invention the first conductor trace and/or the second conductor trace comprises a waveguide.

In this context a waveguide may be any physical structure formed in or at the base structure which structure is capable of guiding electromagnetic signals propagating from the embedded active electronic component to the antenna arrangement (in the transmitting case) and/or vice versa (in the receiving case). Thereby, the respective signal is spatially limited substantially to the width of the waveguide. As a consequence, both a signal loss will be reduced and unwanted electromagnetic radiation propagating in the surrounding will be minimized. Therefore, the operational efficiency and the electromagnetic compatibility of the described component carrier will be improved. This holds in particular for high frequency applications.

The waveguide may spatially bridge the entire distance between the embedded active electronic component and the respective antenna element. This is not only beneficial because of attenuation and electromagnetic compatibility purposes but also with regard to a facilitated manufacturing process of the described component carrier. Preferably, the waveguide is embedded within the base structure such that not only the embedded active electronic component and the antenna arrangement but also the conductor traces are protected from external mechanical impacts.

According to a further embodiment of the invention the component carrier comprises at least one further electronic component, in particular at least one further active electronic component, wherein the further electronic component is operatively connected with the electronic component.

The two electronic components may form an electronic circuit which, in the transmitting case, is not only capable of driving the antenna arrangement in a proper manner but is also capable of controlling the entire radiant emittance. Further, parts of such an electronic circuit may take care of a proper signal conditioning. This may take place with respect to analog signals and/or with respect to digital signal. The digitals signals may be processed for instance with regard to the quality of a radio channel extending between a radio communication (end) device comprising the described component carrier and a further radio communication (end) device being in radio communication with the radio communication (end) device. In this case the signal conditioning may include for instance a proper selection of the number or the size of guard intervals which may be necessary in a radio communication because they allow that reflections of electromagnetic waves travelling between the transmitting radio communication (end) device and the receiving radio communication (end) device to decay before a subsequent electromagnetic wave transmitted by the transmitting radio communication (end) device is received by the receiving radio communication (end) device.

Preferably, also the further electronic component is embedded within the base structure. However, it is also possible that one or more further electronic components are mounted, in particular surface mounted, at the base carrier. Furthermore, it is also possible that the described electronic circuit comprises components which are external with respect to the component carrier.

In accordance with the electronic component also the further electronic component can comprise or can consist of two or more electronic component parts, which are realized within a dedicated housing.

According to a further embodiment of the invention the antenna arrangement further comprises at least one further antenna element, which is embedded within the base structure and which is operatively connected with at least one active component. This may provide the advantage that a so called Phase Antenna Array (PAA) can be formed which is embedded within the base structure. Such a PAA may allow, typically depending on the number of involved antenna elements, for a high directional sensitivity. In accordance with the basic physical principles of electromagnetic radiation originating in a coherent manner from a plurality of radiation sources the directional radiation pattern for transmitting or for receiving (coherent) electromagnetic radiation can be selected by choosing appropriate phase or run-time differences between different antenna elements.

According to a further embodiment of the invention one antenna element of the antenna elements is formed within an opening which itself is formed at an upper surface of the base structure and within the base structure.

The size of the opening may particularly depend on the frequency respectively the wavelength of the electromagnetic radiation at which the described component carrier is supposed to be operated. The shape of the opening may be selected depending on the specific application, in particular to a desired three-dimensional radiation pattern.

Preferably, each antenna element is formed within one opening. This means that the number of openings is the same as the number of antenna elements.

The antenna elements may be realized by an appropriate metallization formed within the respective opening and being electrically connected with the embedded active electronic component.

An antenna element may be formed completely at the wall of the opening or only partially at the wall of the opening. In the latter case the antenna arrangement may be designed in such a manner that only one of two portions of the respective antenna element is located within the opening respectively at the wall of the opening. The other portion may be located anywhere else at or within the base structure. In particular, an appropriately structured metallic layer may be used as the other portion of the antenna arrangement.

With respect to the surface of the base structure the antenna elements may be recessed or deepened. This may provide the advantage that the surface of the base structure will be free of any (metallic) structures representing at least a part of the antenna elements. As a consequence, the surface of the component carrier can be treated or processed at least to some extend without taking care of the antenna elements.

According to a further embodiment of the invention the opening is at least partially a slot having a first sidewall portion and a second sidewall portion being opposite and parallel to the first sidewall portion.

Realizing the opening in the form of a slot or slit may provide the advantage that the opening within the base structure can be formed in an easy manner for instance by a simple milling procedure. Further, the shape and the spatial dimension of the opening can be selected easily depending on the respective application. These benefits can be realized both in connection with a passage opening as well as in connection with a blind opening as will be specified below.

According to a further embodiment of the invention an upper edge of the opening describes a closed line at the upper surface of the base structure. This may mean that the opening is not a recess at an lateral edge or at a lateral region of the base structure. The described opening is rather a hole, a hollow space, a chamber, and/or a cavity which is formed within the base structure and which within any plane being parallel to the upper surface or a lower surface of the base structure is surrounded by the base structure.

In the context of this document the upper surface and a lower surface of the base structure may be surfaces which are located within a plane being parallel to a layer structure of the base structure. In this respect the upper surface and a lower surface may be planar surfaces.

According to a further embodiment of the invention the one antenna element is formed at least partially at a side wall of the opening. This may provide the advantage that a large area, which defines the opening, can be used for forming one of the antenna elements. This holds in particular if the opening has a comparatively small dimension along any direction being parallel to the (upper) surface of the base structure respectively the component carrier. When using the side wall of the opening for forming an antenna element, the antenna element can, depending on the specific application, realized with an appropriate structural design.

According to a further embodiment of the invention the opening is a passage opening which extends from the upper surface to an opposing lower surface of the base structure. This may mean that the opening of the full passage completely extends through the base structure from the upper surface until the lower surface.

A passage opening may provide the advantage that it can be easily formed within the base structure. This can be realized for instance by means of a known drilling or milling procedure. Alternatively, the passage opening can also be formed during a formation in layers of the base structure, wherein the involved layers comprise appropriately formed and located cut outs. In particular in case of a cylindrical form of the passage opening the passage opening may be a so called through hole.

The antenna elements can be placed anywhere on or at the base structure, including its top side, bottom side, and/or edge. With an optimal placement of the antenna elements it may be possible to compensate at least partially negative effects (e.g. an unwanted distortion of the electromagnetic fields), that may be induced by an outer housing of an electronic device (e.g. a mobile phone) and/or by the surrounding of the electronic device and/or by other nearby electronic components which may be mounted at or embedded within the component carrier.

According to a further embodiment of the invention the opening is a blind opening, which extends from the upper surface of the base structure into the interior of the base structure. This may provide the advantage that the lower surface of the base structure will not be affected by the opening and the entire area of the lower surface can be used for mounting or attaching electronic components and/or for forming conductive traces at the lower side of the base structure.

In this document the term "blind opening" may particularly denote any opening or cavity, which does not go completely through the base structure. In case of a cylindrical form of the blind opening the blind opening can be called a blind hole or a blind via.

According to a further embodiment of the invention the one antenna element is formed at least partially at a bottom wall of the blind opening. This may provide the advantage that a large area which delimits the opening within the base structure from the physical structure of the base structure can be used for forming the respective antenna element. This gives an engineer, who is designing the component carrier for a specific application, a high flexibility with regard to possible designs of the antenna elements.

According to a further embodiment of the invention the opening is filled at least partially with a non-conductive metallic material. This may provide the advantage that possibly mechanically sensitive portions of the respective antenna element can be protected.

The described non-conductive material should be a material which allows high frequency electromagnetic waves to pass with no or with only a very low attenuation. A suitable material may be basically any material which has a relative permittivity which is larger than 1, in particular larger than 1.5, more particular larger than 2, even more particular more than 2.5 and most particular more than 3.

It is mentioned that apart from embodiments according to which the non-conductive material completely fills the opening it is also possible that in addition the non-conductive material covers at least some parts of the base structure. In one embodiment the described component carrier even forms the housing of a radio communication device. Thereby, it may even be possible that the described non-conductive material acts as a cover layer for protecting the entire component carrier respectively the entire radio communication device from unwanted external impacts.

The non-conductive material may be for instance a non-metallic material or a material containing metals but being a bad conductor such as for example Aluminum oxide.

According to a further embodiment of the invention the non-conductive material is at least one of a solder resist material, a heat transfer paste, a flexi print material, a removable filling material, a paint and a lacquer. This may provide the advantage that apart from the mechanical protection of the antenna arrangement the non-metallic material can also be used for other purposes in connection with processing, using and protecting component carriers such as printed circuit boards or substrates. Specifically, the described non-metallic material can be applied or inserted into the openings together with a component carrier production process step which is anyhow needed. This means that the described mechanical protection can be realized without any additional effort.

In this context a "flexi print material" is a material which is typically used for building up flexible printed circuit boards by means of flexible plastic substrates, such as polyimide, Polyether ether ketone (PEEK) or transparent conductive polyester film. Further, in the context of this document a "removable filling material" is a material which during production of a component carrier is used as a temporary placeholder when forming the component carrier. At a later production step the placeholder is removed such that a cavity or any type of free space is generated into which another material, e.g. an electronic component, is filled or embedded.

According to a further embodiment of the invention (a) the base structure comprises at least a first metallic layer and a second metallic layer being separated by at least one dielectric layer and (b) each one of the antenna elements includes at least a part of the first metallic layer and at least a part of the second metallic layer. This may provide the advantage that the antenna elements are spatially not limited to the wall of the respective opening but can extend also along an x- and/or y-direction both being parallel to the (upper) surface of the base structure. Depending on the design and the size of a patterned portion of the respective metallic layer the size of the respective antenna element can be adjusted properly.

According to a further embodiment of the invention (a) within the first metallic layer one of the antenna elements has a first spatial spread and (b) within the second metallic layer the one of the antenna elements has a second spatial spread, which is different from the first spatial spread.

Generally speaking, the mentioned antenna element has different shapes and/or dimensions within different metallic layers of the base structure. By appropriately forming the different portions of the antenna element the sensitivity of the antenna arrangement for receiving electromagnetic radiation may be not spatially uniform and can be adjusted properly depending on the specific application of the described electronic assembly. Therefore, the above elucidated beam forming respectively directional sensitivity can be supported by a proper shape of the antenna elements. Since the shape of the antenna elements relies on the patterned structure of the first metallic layer and the second metallic layer, appropriately formed antenna elements can be realized very easy together with a production of the layered base structure.

It is mentioned that the antenna elements can also extend over more than two metallic layers. This may allow for realizing the antenna elements with a plurality of antenna element portions each being assigned to a different metallic layer and preferably each having a different spatial spread.

According to a further embodiment of the invention the base structure is a layered structure comprising at least two dielectric layers each being sandwiched between respectively two metal layers.

Descriptive speaking, the base structure (and also the entire component carrier) comprises an alternating sequence of metal layers and dielectric or insulating layers. Such a structure may also be denominated a Multi-layer board. Though holes or blind holes can be used for interconnecting different metal layers in order to increase the integration density in particular of signal traces formed on and/or within the base structure.

In this document the term "sandwiched" may refer to any layered structure wherein one (sandwiched) layer is located in between two (sandwiching) layers. Thereby, the sandwiched layer may be clamped with force or pressure by the sandwiching layer. However, also a simple middle or center location of the sandwiched layer is possible, where there is no force or pressure acting from the sandwiching layers onto the sandwiched layer.

The layered structure may be configured as one of the group consisting of a printed circuit board, and a substrate. In the context of this document, the term "printed circuit board" (PCB) may particularly denote a plate-shaped bare component carrier which is formed by laminating several electrically conductive layer structures with several electrically insulating layer structures, for instance by applying pressure, if desired accompanied by the supply of thermal energy. As preferred materials for PCB technology, the electrically conductive layer structures are made of copper, whereas the dielectric or electrically insulating layer structures may comprise resin and/or glass fibers, so-called prepreg or FR4 material. The material used for the dielectric layers may comprises at least one of the group consisting of resin, in particular Bismaleimide-Triazine resin, cyanate ester, glass, in particular glass fibers, prepreg material, liquid crystal polymer, epoxy-based Build-Up Film, the above mentioned FR4 material, a ceramic, and a metal oxide. Although prepreg or FR4 are preferred, the other mentioned material or still other materials may be used as well.

The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from the described embedded active electronic component, a printed circuit board is usually configured for accommodating one or more electronic components on one or both opposing surfaces of the plate-shaped printed circuit board. They may be connected to the respective main surface by soldering.

In the context of this document the term "substrate" may particularly denote a small bare component carrier having substantially the same or a slightly larger size as a typical electronic component to be mounted thereon.

According to a further embodiment of the invention the base structure is at least partly made from flexible materials.

Preferably, the base structure is made exclusively from more or less elastic materials, which provide for a certain flexibility of the entire component carrier. A flexible design of the component carrier opens a variety of radio communication applications for which the described component carrier can be used. Further, an engineer, who is doing constructional work with the described component carrier for a specific application will gain a welcome flexibility for integrating the described component carrier into an electronic device, in particular a radio communication end device.

Suitable elastic or flexible materials may be polyimide, PEEK, and polyester. Although polyimide is a preferred material, the other mentioned materials or other flexible materials may be used as well.

According to a further aspect of the invention there is provided an electronic apparatus, in particular a radio communication (end) device. The electronic apparatus comprises a component carrier as described above.

The provided electronic apparatus is based on the idea that using the above described component carrier in particular for radio communication allows the electronic apparatus (a) to be realized within a compact design and (b) to be provided with a directional radio transmitting and radio receiving characteristic or pattern which may yield a high efficiency with regard to the power needed for radio communication. As a consequence, the transmit power can be reduced and the receive sensitivity can be increased. Further, in order to guarantee for a reliable radio communication the directional transmit and/or receive pattern can be adapted to the actual environmental surroundings. Further, a proper directional transmit characteristic may be exploited towards a reduced electromagnetic impact on persons being located near the described radio communication device.

The communication (end) device might be any type of radio equipment which is capable of connecting with an arbitrary other radio communication device or a radio communication access point of a network such as a base station or a relay node of a cellular radio network. For instance, the radio equipment may be a RFID communication device such as an active RFID tag, a Near Field Communication (NFC) device or any other movable radio communication apparatus such as a cellular mobile phone, a Personal Digital Assistant (PDA), and/or a notebook or tablet computer.

According to a further embodiment of the invention the electronic apparatus further comprises a housing structure; wherein the component carrier forms at least a part of the housing structure. This may provide the advantage that the production costs for the electronic apparatus can be reduced because there is no need to provide for a (complete) housing. In other words, the component carrier, which is used for building up an electronic circuit now also has the functionality to act as at least a part of the housing.

In case the electronic apparatus is a radio communication device a highly efficient and sensitive radio communication can be realized in an economically priced manner. Thereby, benefit may be taken from preferred embodiments of the component carrier, wherein in particular the antenna arrangement is protected from external mechanical impacts.

According to a further aspect of the invention there is provided a method for manufacturing a component carrier, in particular a component carrier as described above. The provided method comprises (a) providing a base structure; (b) forming an antenna arrangement having a at least a first antenna element and a second antenna element, wherein both antennas elements are embedded within the base structure; (c) embedding an electronic component within the base structure; and (d) connecting the electronic component both with the first antenna element and with the second antenna element. In accordance with this aspect of the invention the electronic component is an active electronic component which is capable of (i) providing a first transmit signal to the first antenna element and a second transmit signal to the second antenna element and/or (ii) processing a first receive signal received from the first antenna element and a second receive signal received from the second antenna element.

It has to be noted that embodiments of the invention have been described with reference to different subject matters. In particular, some embodiments have been described with reference to apparatus type claims whereas other embodiments have been described with reference to a method type claim. However, a person skilled in the art will gather from the above and the following description that, unless other notified, in addition to any combination of features belonging to one type of subject matter also any combination between features relating to different subject matters is considered as to be disclosed with this document.

The aspects defined above and further aspects of the present invention are apparent from the examples of embodiment to be described hereinafter and are explained with reference to the examples of embodiment. The invention will be described in more detail hereinafter with reference to examples of embodiment but to which the invention is not limited.

DETAILED DESCRIPTION OF ILLUSTRATED EMBODIMENTS

Figure 1A:
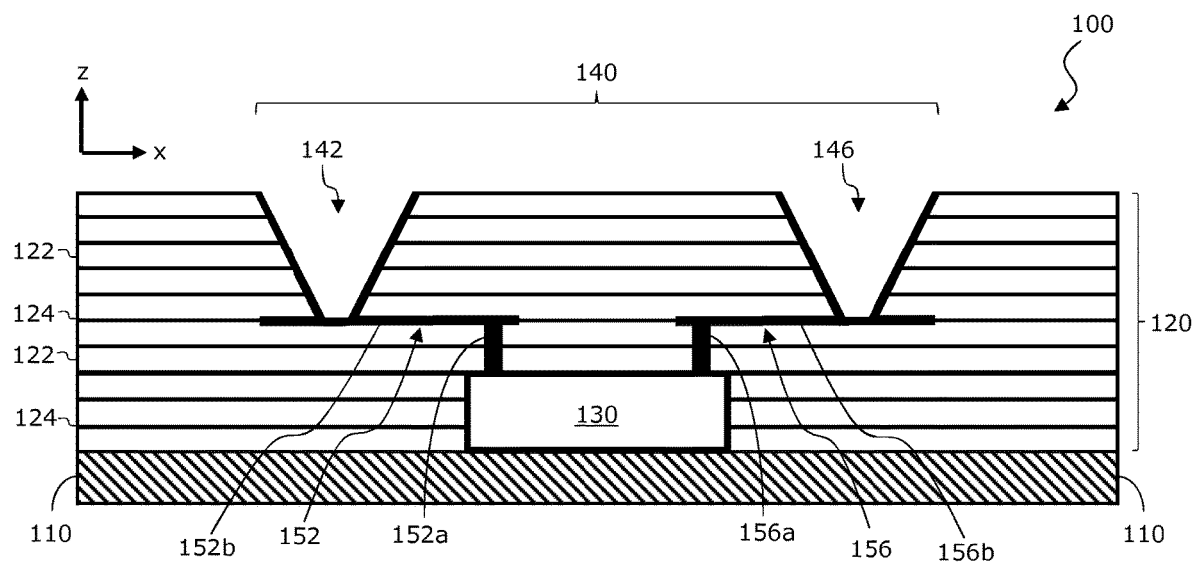
FIGS. 1a and 1b show a component carrier with an antenna arrangement comprising two cone shaped antenna elements formed within a laminated base structure.

The illustration in the drawing is schematic. It is noted that in different figures, similar or identical elements or features are provided with the same reference signs or with reference signs, which are different from the corresponding reference signs only within the first digit. In order to avoid unnecessary repetitions elements or features which have already been elucidated with respect to a previously described embodiment are not elucidated again at a later position of the description.

Further, spatially relative terms, such as "front" and "back", "above" and "below", "left" and "right", et cetera are used to describe an element's relationship to another element(s) as illustrated in the figures. Thus, the spatially relative terms may apply to orientations in use which differ from the orientation depicted in the figures. Obviously all such spatially relative terms refer to the orientation shown in the figures only for ease of description and are not necessarily limiting as an apparatus according to an embodiment of the invention can assume orientations different than those illustrated in the figures when in use.

Figure 1B:
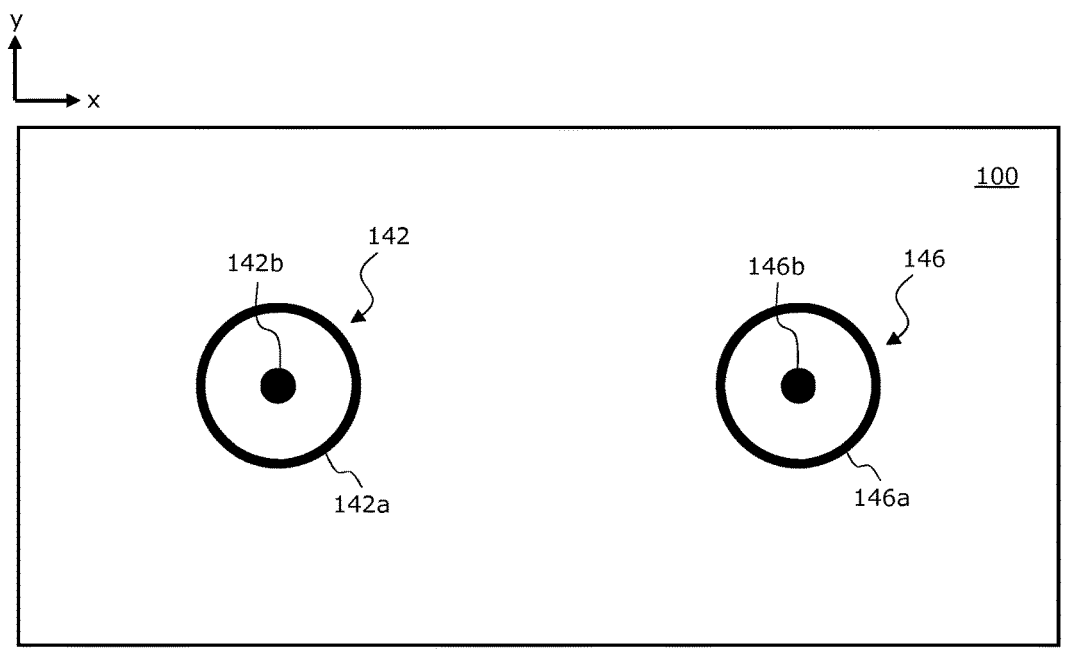

FIGS. 1a and 1b show a component carrier 100 in accordance with an embodiment of the invention. The component carrier 100 comprises a core 110, which represents a backbone providing a certain mechanical stability for the component carrier 100. Above or over the core 110 there is formed a base structure 120 comprising an alternating sequence of dielectric layers 122 and electrically conductive respectively metallic layers 124. In this document the base structure 120 is also referred to as a laminate structure.

Within the base structure 120 and adjacent the core 110 there is provided an embedded electronic component 130. In other embodiments the component is completely surrounded by the base structure 120, i.e. there is no mechanical contact between the embedded electronic component 130 and the core 110. In other embodiments, the embedded electronic component is located within the core. In other embodiments there can be an additional structure (at least similar to the base structure 120) provided also at the other side of the core 110.

The component carrier 100 further comprises an antenna arrangement 140, which is formed within an upper portion of the base structure 120. According to the embodiment described here the antenna structure 140 comprises two antenna elements, a first antenna element 142 and a second antenna element 146. As can be seen from FIG. 1a, the two antenna elements 142 and 146 each comprise a right circular truncated cone shape. Specifically, the antenna elements 142 and 146 are formed by means of a metallization of the inner side surface and the bottom surface. FIG. 1b shows in a top view of the component carrier the respective upper edges 142a and 146a as well as the respective bottom areas 142b and 146b.

It is mentioned that depending on the specific configuration of the cone shaped antenna elements 142, 146 the bottom areas 142b and 146b may include a not depicted Rx/Tx element, e.g. a dipole Rx/Tx element, the structure of which cannot be seen in FIGS. 1a and 1b and also in the further FIGS. 2 and 3 elucidated below.

The embedded electronic component 130 comprises several contact terminals (not depicted explicitly). One contact terminal is connected to the first antenna element 142 via a first conductor trace 152. The first conductor trace 152 comprises two straight conductor trace portions. According to the embodiment described here a first straight conductor trace portion is realized by means of a via 152a (extending in the vertical direction). The second straight conductor trace portion is realized by means of a portion 152b of a patterned metallic layer 124. Accordingly, the second conductor trace 156 comprises two straight conductor trace portions which are realized by means a via 156a and another portion 162b of the patterned metallic layer 124.

By means of the two conductor traces 152 and 156 the component 130 is operatively connected both with the first antenna element 142 and with the second antenna element 146. In other embodiments, there are additional functional elements or components inserted in the operative connection between the antenna elements 142, 146 and the component 130. The embedded electronic component 130 is an active electronic component which is capable of providing a first transmit signal to the first antenna element 142 and a second transmit signal to the second antenna element 146. Alternatively or in combination the active electronic component 130 is capable of processing a first receive signal received from the first antenna element 142 and a second receive signal received from the second antenna element 146. As has been elucidated above in more detail the antenna arrangement 140 is a so called Phase Antenna Array (PAA) which is formed respectively embedded within the base structure 120. Of course, the PAA can also comprise further antenna elements. By appropriately operating the antenna element 142, 146 a beamforming can be achieved. Since the antenna elements 142, 146 can be used both for transmitting and receiving electromagnetic signals beamforming can be applied both for a transmitting radio communication end device and for a receiving radio communication end device.

Figure 2:
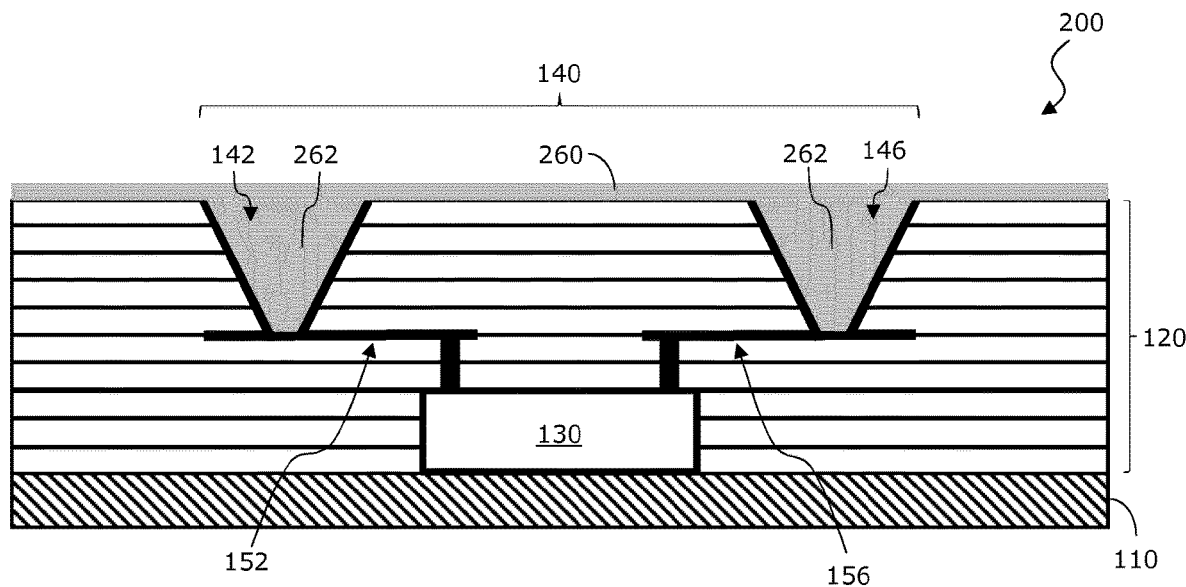
FIG. 2 shows a component carrier corresponding to the component carrier of FIG. 1 which is however covered with a protective coating.

FIG. 2 shows a component carrier 200 according to a further embodiment of the invention. The component carrier 200 basically corresponds to the component carrier 100 shown in FIG. 1*a*. The only (depicted) difference is that there is provided a protective structure at the upper surface of the base structure 120 respectively at the antenna arrangement 140. This protective structure comprises a protective coating 260 and a filling material 262 which has been inserted into the interior of the truncated cone shaped antenna elements 142, 146. According to the embodiment described here the material being used for the protective structure is a so called solder resist material which is widely used for manufacturing component carriers. However, as has already been mentioned above in more detail also other materials such as a heat transfer paste, a flexi print material, a removable filling material, a paint and/or a lacquer can be used for the protective coating 260 and/or for the filling material 262.

Figure 3:
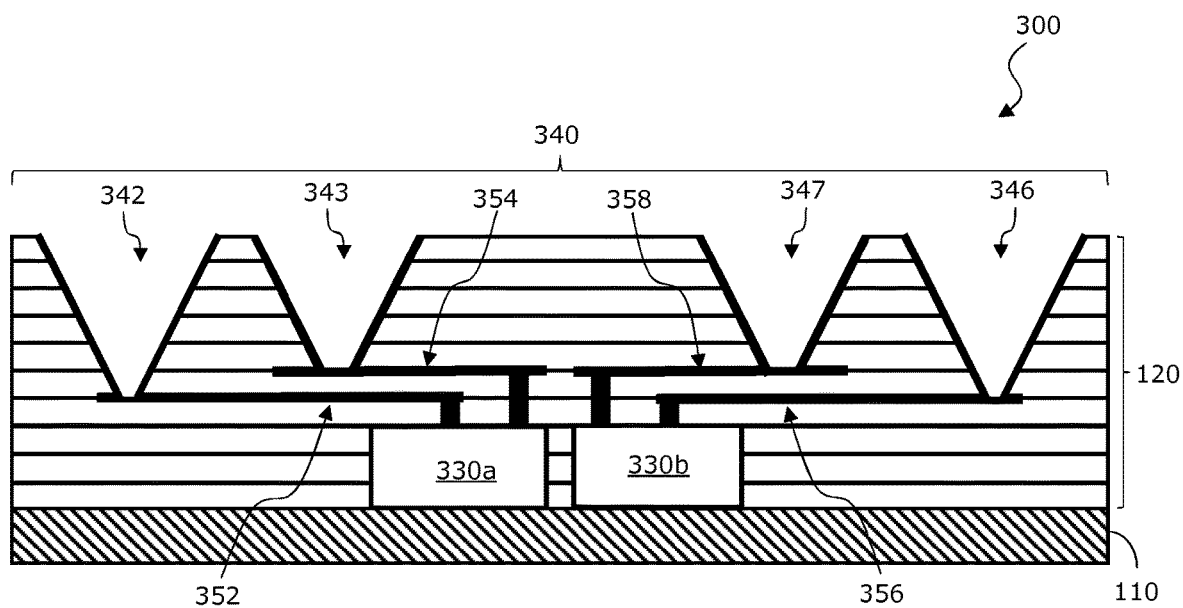
FIG. 3 shows a component carrier with an antenna arrangement comprising four cone shaped antenna elements and with two embedded electronic components being operatively connected with respectively two antenna elements.

FIG. 3 shows in accordance with a further embodiment of the invention a component carrier 300 with an antenna arrangement 340 comprising four truncated cone shaped antenna elements, a first truncated cone shaped antenna element 342, a further first truncated cone shaped antenna element 343, a second truncated cone shaped antenna element 346, and a further second truncated cone shaped antenna element 347. In this embodiment two components 330*a* and 330*b* are embedded within the laminated base structure 120 of the component carrier 300. In order allow for exploiting the directional characteristics offered by the PAA 340 the two embedded electronic components 330*a* and 330*b* are operatively connected with respectively two antenna elements 342, 343 respectively 346, 347. Specifically, the first antenna element 342 is connected with the component 330*a* via a first conductor trace 352. The further first antenna element 343 is connected with the component 330*a* via a further first conductor trace 354. Correspondingly, the second antenna element 346 is connected with the component 330*b* via a second conductor trace 356 and the further second antenna element 347 is connected with the component 330*b* via a further second conductor trace 358. Furthermore, the two embedded electronic components 330*a* and 330*b* are communicatively connected with each other at least by means of a non-depicted data connection embedded within the base structure 120. This allows for a cooperative operation of the two components 330*a* and 330*b* in order to operate the entire antenna arrangement 340 in a proper manner such that the benefits of a PAA can be exploited.

Figure 4A:
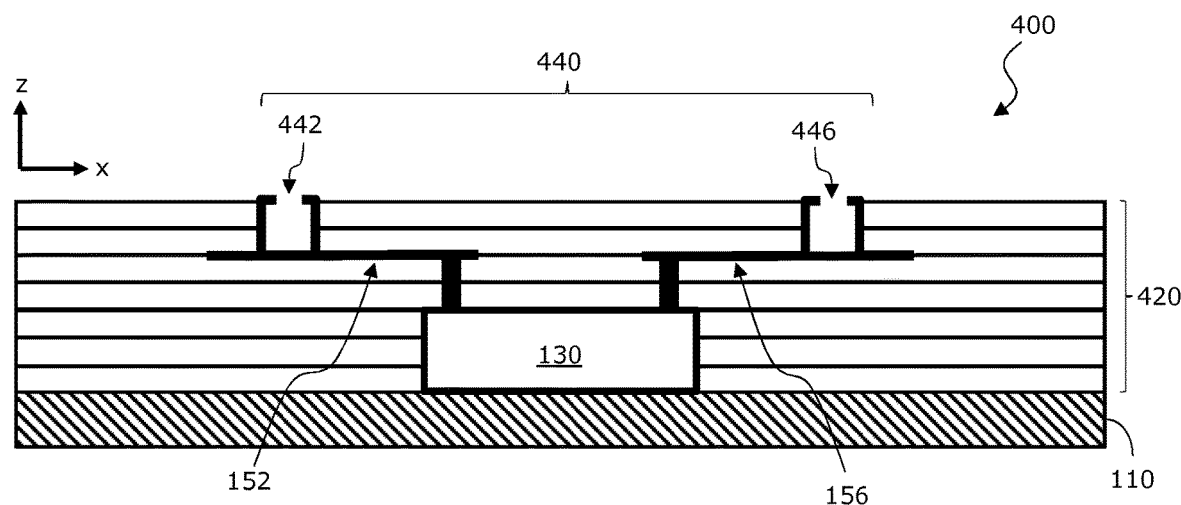
FIGS. 4a and 4b show a component carrier with two hollow conductors each having an opening representing one antenna element.
Figure 4B:
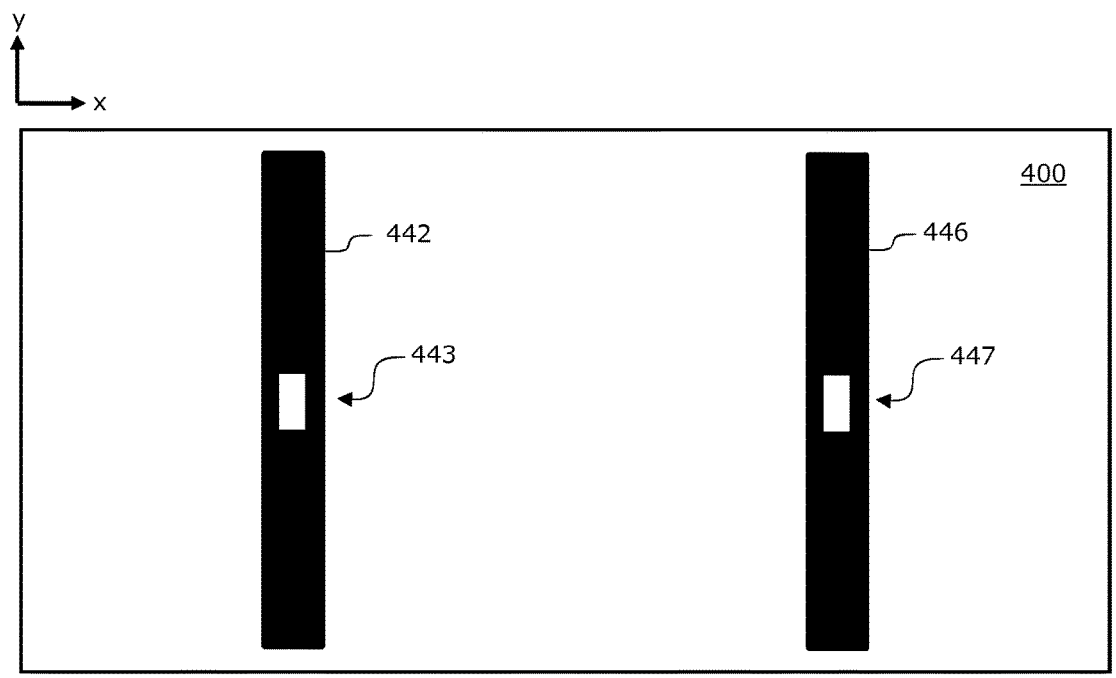

FIGS. 4*a* and 4*b* show a component carrier 400 according to a further embodiment of the invention. Also the component carrier 400 basically corresponds to the component carrier 100 shown in FIG. 1*a*. The only (depicted) two differences are (a) that the number of the layers of the base structure 420 is smaller than the number of layers of the base structure 120 and (b) that instead of (truncated) cone shaped antenna elements the antenna arrangement 440 comprises two hollow conductors or waveguide 442 and 446 each having an opening 443 respectively 447 representing respectively one of the two antenna elements. As can be seen from FIG. 4*b*, the two hollow conductors 442 and 446 extend along a y-direction. Thereby, the y-direction together with a x-direction being perpendicular to the y-direction define a plane being parallel to the layers forming the base structure 420. According to the embodiment described here each one of the openings within the respective hollow conductor 442, 446 is realized by means of a comparatively short slot 443, 447 extending along the y-direction.

Figure 5A:
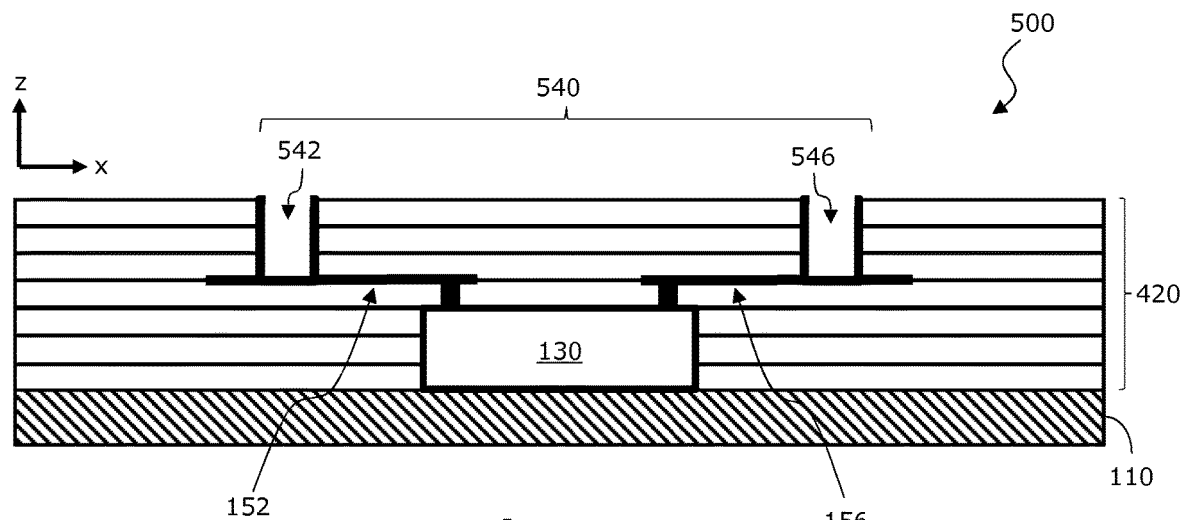
FIGS. 5a and 5b show a component carrier with two antenna elements each being realized by a metallized slot.
Figure 5B:
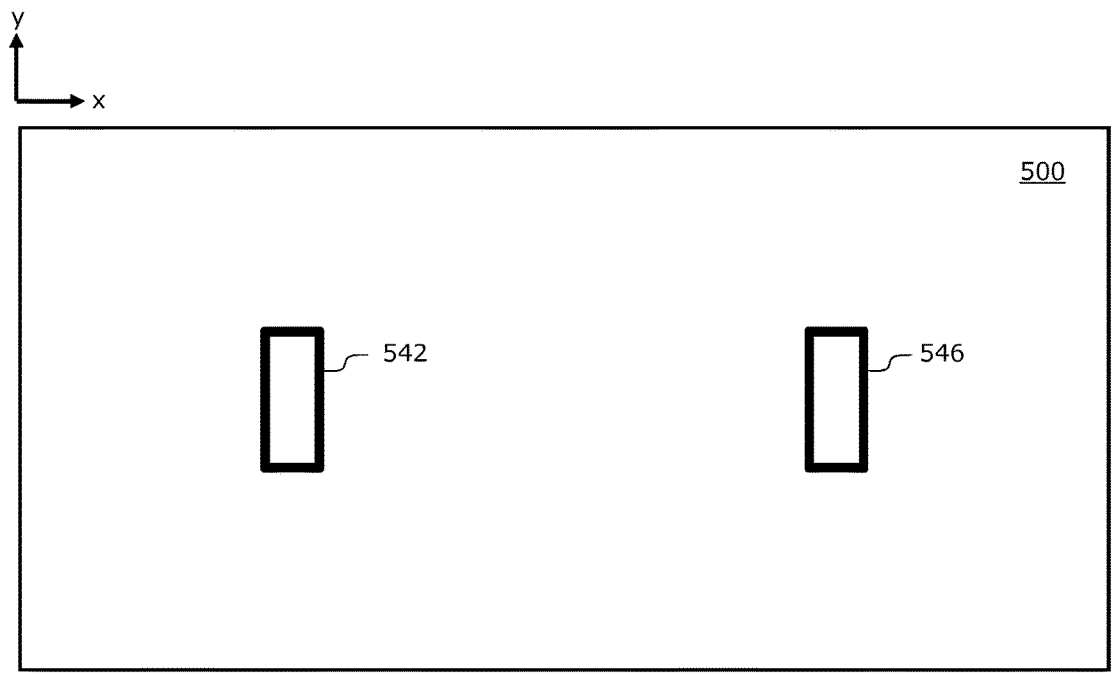

FIGS. 5*a* and 5*b* show a component carrier 500 according to a further embodiment of the invention. By contrast to the component carrier 400 the component carrier 500 comprises an antenna arrangement 540, wherein the first antenna element and the second antenna element are realized by means of a first slot 542 and a second slot 546, respectively. As can be seen from FIG. 5*a*, the two slots 542 and 546 have the form of a blind opening. As can be seen from FIG. 5*b*, each one of the two slots 542, 546 has a slightly elongated shape oriented along the y-direction.

Figure 6A:
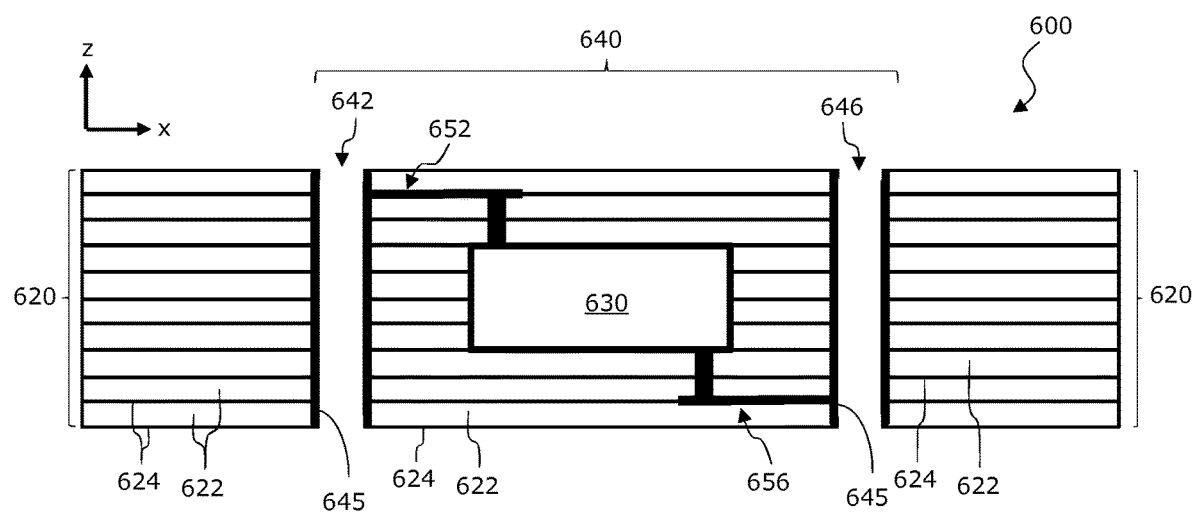
FIGS. 6a and 6b show a component carrier with two metallized passage openings extending through a laminated structure, wherein each metallized passage opening represents one antenna element.
Figure 6B:
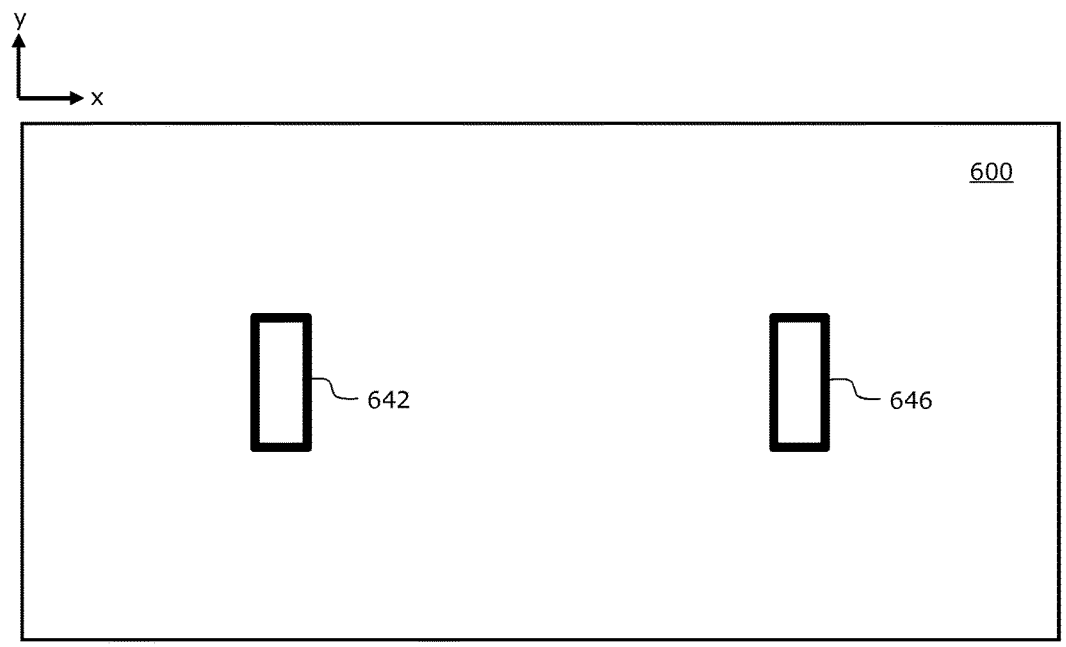

FIGS. 6*a* and 6*b* show a component carrier 600 according to a further embodiment of the invention. The component carrier 600 comprises a laminated base structure 620 which is formed by an alternating sequence of dielectric layers 622 and metallic layers 624. It is mentioned that in the described embodiment there is no core layer. However, it is pointed out that at least one of the dielectric layers 624 may be different from the others and may provide for a mechanical stability such that this layer can be denominated a core layer.

As can be seen from FIG. 6*a*, within the base structure 620 there are formed two passage openings 642 and 646. In a view along the z-direction the passage openings 642, 646 have the shape of a rectangle (see FIG. 6*b*). In other words, the passage openings 642 and 646 are realized by respectively one slightly elongated slot extending along the z-direction through the entire base structure 620. According to the embodiment described here the passage openings represent a first antenna element 642 respectively a second antenna element 646 both forming an antenna arrangement 640.

Specifically, the sidewalls of the passage openings 642, 646 are provided with an electrically conductive respectively metallic coating 645. This coating 645 being located within the first passage opening 642 is connected via a first conductor trace 652 with an embedded electronic component 630. Correspondingly, the coating 645 being located within the second passage opening 646 is connected via a first conductor trace 652 with the embedded electronic component 630.

It is noted that according to the embodiment described here the embedded electronic component 630 comprises (a) at its upper surface a non-depicted first contact terminal being connected with the first conductor trace 652 and (b) at its bottom surface and non-depicted second contact terminal being connected with the second conductor trace 656. Of course, other spatial arrangements of contact terminals of the embedded electronic component are possible when providing accordingly formed conductor traces for connecting the electronic component with the antenna elements 642 and 646.

Figure 7:
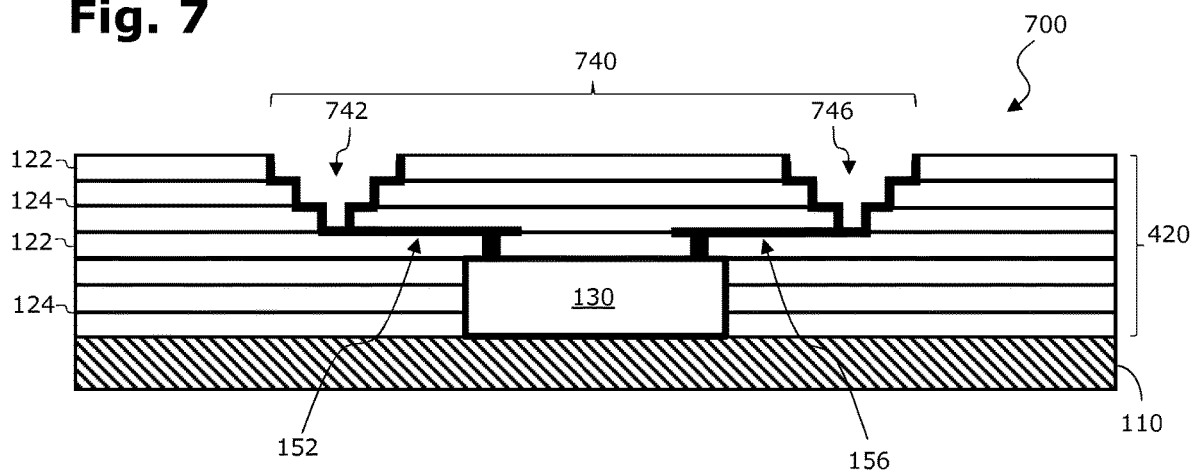
FIG. 7 shows a component carrier with two metallized step horns formed within a laminated base structure.

FIG. 7 shows a component carrier 700 which differs from the component carrier 400 shown in FIGS. 4a and 4b in that the antenna elements are formed by a metallized recesses having the shape of a step horn. Specifically, an antenna arrangement 740 formed within an upper portion of the base structure 420 comprises a first step horn 742 representing a first antenna element and a second step horn 746 representing a second antenna element.

Figure 8:
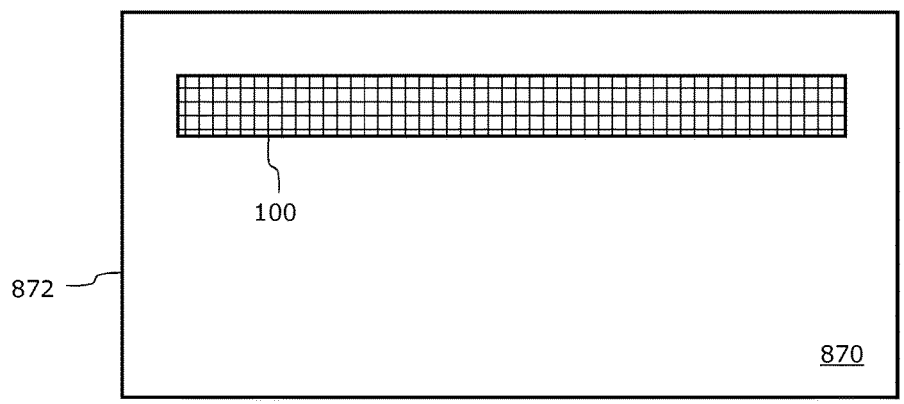
FIG. 8 shows an electronic apparatus accommodating, within a housing, a component carrier in accordance with an embodiment of the invention.

FIG. 8 shows in a schematic illustration an electronic apparatus 870. The electronic apparatus 870 comprises a housing 872. The electronic apparatus 870 further comprises a component carrier in accordance with an embodiment of the invention, for instance the component carrier 100. The component carrier 100 is accommodated within the housing 872.

The electronic apparatus 870 described here is a radio communication (end) device which can be used for a radio communication within a radio communication network. Thereby, benefits may be taken in particular from the matter of fact that the component carrier 100 comprises all features respectively elements, which are necessary for performing the above mentioned beamforming.

Figure 9:
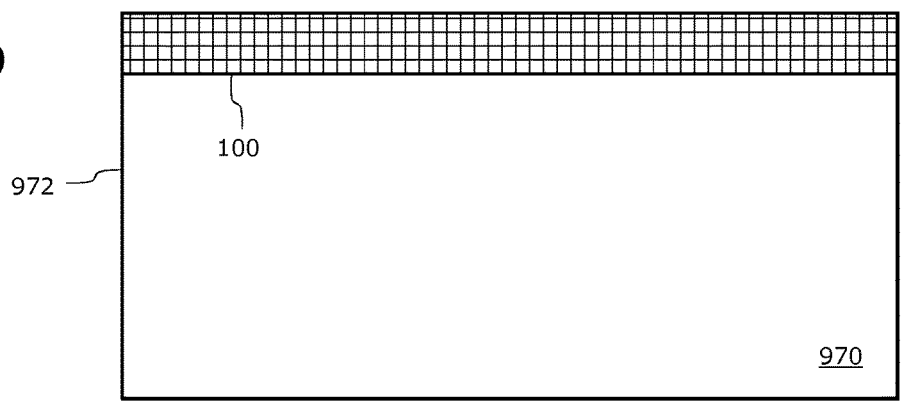
FIG. 9 shows an electronic apparatus with a housing being formed partially by a component carrier in accordance with an embodiment of the invention.

FIG. 9 shows again in a very schematic illustration an electronic apparatus 970 according to a further embodiment of the invention. The electronic apparatus 970 comprises a housing 972. As can be seen from FIG. 9, the component carrier 100 forms an (upper) part of the housing 972. Also the electronic apparatus 970 is a radio communication (end) device.

Apart from providing the advantage that the housing 972 can be manufactured in a cost effective manner the described electronic apparatus 970 may further provide the advantage that the (non-depicted) antenna arrangement is realized at an outer side of the housing 972. Therefore, there is no attenuation of electromagnetic radiation caused by the housing 972.

It should be noted that the term "comprising" does not exclude other elements or steps and the use of articles "a" or "an" does not exclude a plurality. Also elements described in association with different embodiments may be combined.

LIST OF REFERENCE SIGNS 110 core
120 base structure/laminate
122 dielectric layer
124 metallic layer
130 embedded electronic component
140 antenna arrangement/Phased Antenna Array (PAA)
142 first antenna element
142a upper edge
142b bottom area/bottom wall
146 second antenna element
146a upper edge
146b bottom area
152 first conductor trace
152a via/straight conductor trace portion
152b patterned metallic layer portion/straight conductor trace portion
156 second conductor trace
156a via/straight conductor trace portion
156b patterned metallic layer portion/straight conductor trace portion
200 component carrier
260 protective coating/solder resist
262 filling material/solder resist
300 component carrier
330a embedded electronic component
330b embedded electronic component
340 antenna arrangement/Phased Antenna Array (PAA)
342 first antenna element
343 further first antenna element
346 second antenna element
347 further second antenna element
352 first conductor trace
354 further first conductor trace
356 second conductor trace
358 further second conductor trace
400 component carrier
420 base structure/laminate
440 antenna arrangement
442 first antenna element/first waveguide/first hollow conductor
443 opening/slot
446 second antenna element/second waveguide/second hollow conductor
447 opening/slot
542 first antenna element/first slot/first blind opening
546 second antenna element/second slot/second blind opening
600 component carrier
620 base structure/laminate
622 dielectric layer
624 metallic layer
630 embedded electronic component
640 antenna arrangement
642 first antenna element/first passage opening
645 metallic coating
646 second antenna element/second passage opening
652 first conductor trace
656 second conductor trace
700 component carrier
740 antenna arrangement
742 first antenna element/first step horn
746 second antenna element/second step horn
870 electronic apparatus/radio communication (end) device
872 housing
970 electronic apparatus/radio communication (end) device
972 housing

The invention claimed is:

1. A component carrier, comprising:
a base structure;
an antenna arrangement having at least a first antenna element and a second antenna element, wherein both antennas elements are embedded within the base structure; and
an electronic component, which is embedded within the base structure and which is operatively connected both with the first antenna element and the second antenna element,
wherein the electronic component is an active electronic component which is capable of
providing a first transmit signal to the first antenna element and a second transmit signal to the second antenna element and/or
processing a first receive signal received from the first antenna element and a second receive signal received from the second antenna element,
wherein one of the antenna elements is formed within an opening which itself is formed at an upper surface of the base structure and within the base structure.

2. The component carrier as set forth in claim 1, wherein the electronic component is configured for introducing a phase shift between the first transmit signal and the second transmit signal; and/or changing the amplitude of the of first transmit signal and/or of the second first transmit signal; and/or detecting a phase to shift between the first receive signal and the second receive signal; and/or determining the amplitude of the first receive signal and/or of the second receive signal.

3. The component carrier as set forth in claim 1, further comprising:
a first conductor trace connecting the electronic component with the first antenna element; and
a second conductor trace connecting the electronic component with the second antenna element.

4. The component carrier as set forth in claim 3, wherein the first conductor trace and/or the second conductor trace has a length of less than 600 mm.

5. The component carrier as set forth in claim 3, wherein the first conductor trace and/or the second conductor trace consists of a number of N straight conductor trace portions, wherein the number N is smaller than 5.

6. The component carrier as set forth in claim 5, wherein the antenna arrangement and the electronic component are configured for operating at a predetermined wavelength; and
at least one straight conductor trace portion has a length which is less than ½ of the predetermined wavelength.

7. The component carrier as set forth in claim 3, wherein the first conductor trace and/or the second conductor trace comprises a waveguide.

8. The component carrier as set forth in claim 1, further comprising:
at least one further electronic component operatively connected with the electronic component.

9. The component carrier as set forth in claim 1, wherein the antenna arrangement further comprises
at least one further antenna element, which is embedded within the base structure and which is operatively connected with at least one active component.

10. The component carrier as set forth in claim 1, wherein the opening is at least partially a slot having a first sidewall portion and a second sidewall portion being opposite and parallel to the first sidewall portion.

11. The component carrier as set forth in claim 1, comprising at least one of the following features:
an upper edge of the opening describes a closed line at the upper surface of the base structure;
the one antenna element is formed at least partially at a side wall of the opening.

12. The component carrier as set forth in claim 1, wherein the opening is a passage opening which extends from the upper surface to an opposing lower surface of the base structure.

13. The component carrier as set forth in claim 1, wherein the opening is a blind opening, which extends from the upper surface of the base structure into the interior of the base structure and the one antenna element is formed at least partially at a wall of the blind opening.

14. The component carrier as set forth in claim 1, wherein the opening is filled at least partially with a non-conductive material.

15. The component carrier as set forth in claim 14, wherein the non-conductive material is at least one of a solder resist material, a heat transfer paste, a flexi print material, a removable filling material, a paint and a lacquer.

16. The component carrier as set forth in claim 1, comprising at least one of the following features:
the base structure comprises at least a first metallic layer and a second metallic layer being separated by at least one dielectric layer and
the antenna elements include at least a part of the first metallic layer and at least a part of the second metallic layer,
wherein one of the antenna elements has a first spatial spread within the first metallic layer and a remaining one of the antenna elements has a second spatial spread, different from the first spatial spread, within the second metallic layer;
the base structure is a layered structure comprising at least two dielectric layers each being sandwiched between two metal layers, respectively;
the base structure is at least partly made from a flexible material.

17. An electronic apparatus, in particular a radio communication device, the electronic apparatus comprising:
a component carrier having a base structure, an antenna arrangement, and an electronic component;
wherein the antenna arrangement includes a first antenna element embedded in the base structure and a second antenna element embedded in the base structure;
wherein the electronic component is embedded in the base structure, operatively coupled to both the first and the second antenna elements and arranged to
provide a first transmit signal to the first antenna element and a second transmit signal to the second antenna element; or
process a first receive signal received from the first antenna element and a second receive signal received from the second antenna element,
wherein one of the antenna elements is formed within an opening which itself is formed at an upper surface of the base structure and within the base structure.

18. The electronic apparatus as set forth in claim 17, further comprising:
a housing structure;
wherein the component carrier forms at least a part of the housing structure.

19. A method for manufacturing a component carrier, in particular a component carrier, the method comprising:
providing a base structure;
forming an antenna arrangement having at least a first antenna element and a second antenna element, wherein both antennas elements are embedded within the base structure;
embedding an electronic component within the base structure; and
connecting the electronic component both with the first antenna element and with the second antenna element,
wherein the electronic component is an active electronic component which is capable of
providing a first transmit signal to the first antenna element and a second transmit signal to the second antenna element and/or
processing a first receive signal received from the first antenna element and a second receive signal received from the second antenna element,
wherein one of the antenna elements is formed within an opening which itself is formed at an upper surface of the base structure and within the base structure.

* * * * *